United States Patent [19]
Rutkowski

[11] Patent Number: 5,623,503
[45] Date of Patent: Apr. 22, 1997

[54] METHOD AND APPARATUS FOR PARTIAL-SCAN TESTING OF A DEVICE USING ITS BOUNDARY-SCAN PORT

[75] Inventor: Paul W. Rutkowski, Bridgewater, N.J.

[73] Assignee: Lucent Technologies Inc., Murray Hill, N.J.

[21] Appl. No.: 668,502

[22] Filed: Jul. 2, 1996

Related U.S. Application Data

[63] Continuation of Ser. No. 188,872, Jan. 31, 1994, abandoned.

[51] Int. Cl.$^6$ .................................................. G01R 31/28
[52] U.S. Cl. ..................... 371/22.3; 371/22.5; 371/22.1; 371/25.1
[58] Field of Search ................................. 371/22.3, 22.5, 371/24, 25.1, 22.1; 324/158 R, 73.1; 364/490, 580

[56] References Cited

U.S. PATENT DOCUMENTS

| | | | |
|---|---|---|---|
| 4,669,061 | 5/1987 | Bhavsar | 371/22.3 |
| 4,947,357 | 8/1990 | Stewart | 364/580 |
| 5,043,986 | 8/1991 | Agrawal | 371/25.1 |
| 5,323,400 | 6/1994 | Agarwal | 371/22.3 |
| 5,329,533 | 7/1994 | Lin | 371/22.3 |

OTHER PUBLICATIONS

P.H. Bardell, W.H. McAnney, and J. Savir, Built–In Test for VLSI: Pseudorandom Techniques, Wiley Interscience 1987), pp. 241–242.
F. Brglez, P. Pownall, and R. Hum, "Applications of Testability Analysis: from ATPG to Critical Delay Path Trading", Proc.Int'l.Test Conf., pp. 705–712, 1984.
IEEE Standard Test Access Port and Boundary–Scan Architecture, May 1990, Ch. 5, pp. 5–1 thru 5–15.

Primary Examiner—Robert W. Beausoliel, Jr.
Assistant Examiner—Nadeem Iqbal

[57] ABSTRACT

Partial-Scan testing of an integrated circuit (10) having a Boundary-Scan architecture (18) is accomplished by way of a Partial-Scan controller (36) contained within the integrated circuit. In response to control signals generated by Boundary-Scan architecture (18), the Partial-Scan controller (36) generates a set of Partial-Scan control signals for causing the integrated circuit to accomplish Partial-Scan testing. In this way, the Partial-Scan control signals necessary to accomplish Partial-Scan testing are generated internally, rather than requiring a separate set of input pins to receive the Partial-Scan control signals from an external source.

6 Claims, 3 Drawing Sheets

STATE DIAGRAM

METHOD AND APPARATUS FOR PARTIAL-SCAN TESTING OF A DEVICE USING ITS BOUNDARY-SCAN PORT

This is a Continuation of application Ser. No. 08/188,872 filed Jan. 31, 1994, now abandoned.

TECHNICAL FIELD

This invention relates to a technique for accomplishing Partial-Scan testing of a device, such as an integrated circuit, containing a plurality of flip-flops.

BACKGROUND OF THE INVENTION

Partial-Scan testing has shown much promise for solving the problem of testing large and complex integrated circuits. As taught in U.S. Pat. No. 5,043,986, issued on Aug. 27, 1991, in the names of V. D. Agrawal and K. Cheng, and assigned to AT&T (herein incorporated by reference), an integrated circuit, containing flip-flops and combinational logic elements, can be Partial-Scan tested by first isolating a small set of flip-flops, referred to as "scan" flip-flops. The scan flip-flops are selected such that while the integrated circuit is in a test mode, substantially all feedback paths equal to or greater than a prescribed cycle length are eliminated. A feedback path is defined as a signal path from a flip-flop output to one of its inputs whereas the cycle length is defined as the number of non-scan flip-flops in such a feedback path. Once selected, the scan flip-flops are configured in one or more chains.

To accomplish Partial-Scan testing, each chain of scan flip-flops is loaded with test data while the remainder of the integrated circuit is placed in a non-operational mode (i.e., the non-scan flip-flops are disabled). At the outset of testing, the integrated circuit is placed in a "scan" mode during which test data is loaded into the scan flip-flops and any old data present therein is shifted out. Thereafter, the integrated circuit is placed in an "apply" mode for a brief interval (wherein all scan and non-scan flip-flops are clocked) to allow the circuit to react to the test data loaded into the scan flip-flop chains as well as externally applied test data. As a consequence, new data may be present for loading into the scan flip-flops. Then, the integrated circuit returns to the "scan" mode and the data present in the scan flip-flop chains are shifted out for analysis while new test values are shifted in.

Partial-Scan testing of an integrated circuit in the manner described above is typically controlled in accordance with three separate control signals: PS_CLOCK, MODE and TEST_EN. The PS_CLOCK signal is a clock signal that clocks the scan flip-flops during the scan mode as well as during the apply mode so that the scan flip-flops can scan in test data and also capture the responses to such test signals. The TEST_EN signal controls the operating state of the integrated circuit in order to render the circuit testable by the Partial-Scan testing technique. In this regard, the TEST_EN signal blocks the asynchronous preset and clear inputs of the non-scan flip-flops and blocks the passage of the operating clock signals to the combinational elements during testing. Also, the TEST_EN signal disables the system clock signals to the scan flip-flops. The MODE signal controls the shifting of test data into and out of the integrated circuit by controlling each of a set of multiplexers, each placed upstream of a separate one of the scan flip-flops in each chain so as to control the passage of signals through the chain of scan flip-flops. The MODE signal also controls a set of multiplexers that multiplex the output data from the integrated circuit. For an integrated circuit to undergo Partial-Scan testing, the above-described Partial-Scan control signals PS_CLOCK, TEST_EN and MODE must be present. In the past, an external test system generated these control signals and supplied them to the integrated circuit via a separate one of three inputs (i.e., pins) to the circuit dedicated for this purpose.

In addition to being configured for Partial-Scan testing, an integrated circuit may also be configured for Boundary-Scan testing in accordance with the IEEE 1149.1 Boundary-Scan standard (May 21, 1990), described in the publication *IEEE Standard Test Access Port and Boundary-Scan Architecture*, published by the IEEE, Piscataway, N.J. (herein incorporated by reference). To be Boundary-Scan compliant in accordance with the IEEE 1149.1 standard, an integrated circuit must have a Test Access Port (TAP) provided with a Test Data Input (TDI), a Test Clock (TCK) input, a Test Mode Select (TMS) input and a Test Data Output (TDO). Optionally, the TAP may include a Test Reset (TRST) input as well. Thus, at least four dedicated pins are required for Boundary-Scan compliance. In order to facilitate both Partial-Scan testing and Boundary-Scan testing, the integrated circuit must possess seven dedicated pins for test purposes, four for Boundary-Scan and three for Partial-Scan.

The need to dedicate at least seven pins of the integrated circuit for testing purposes reduces the number of pins available for normal (i.e., non-test) operation. Thus, there is a need for a technique for carrying out Boundary-Scan testing and Partial-Scan testing of an integrated circuit while reducing the number of pins required for testing purposes.

SUMMARY OF THE INVENTION

Briefly, the present invention provides a technique for Partial-Scan testing of a Boundary-Scan architecture integrated circuit having a core logic comprised of: scan flip-flops, non-scan flip-flops, and a combinational logic network. The method of the invention is practiced by loading a Partial-Scan test instruction through a Test Access Port (TAP) comprising part of the Boundary-Scan architecture of the integrated circuit. The Partial-Scan test instruction loaded through the TAP is received by a TAP controller also comprising part of the Boundary-Scan architecture of the integrated circuit. The TAP controller executes the Partial-Scan test instruction and, in accordance with the instruction and with signals received at its TCK and TDI inputs, supplies control signals to an on-chip, Partial-Scan controller that supplies the scan flip-flops with a PS_CLOCK signal to clock each scan flip-flop so each can be loaded with test data.

Additionally, the Partial-Scan controller also generates the TEST_EN and MODE signals in response to signals generated by the TAP controller upon execution of the Partial-Scan instruction. The TEST_EN signal controls the operating state of the integrated circuit to render the integrated circuit testable by the Partial-Scan testing techniques. The MODE signal controls the shifting of test data into and out of the device as well as the passage of data between the scan flip-flops. Once the scan flip-flops are loaded, the Partial-Scan controller, in response to signals from the TAP controller, causes the integrated circuit to enter the apply mode for a brief interval to react to the test information loaded in the scan flip-flops. Thereafter, the Partial-Scan controller causes the scan flip-flops to shift the information present in the scan flip-flops out of the integrated circuit for comparison to reference data representative of the operation of the integrated circuit when no defects are present.

An advantage of the present invention is that Partial-Scan testing can be effected via the signals at the Boundary-Scan port, eliminating the need for external Partial-Scan control signals. The signals at the TDI and TCK inputs thus do "double-duty" from the standpoint of controlling both Boundary-Scan and Partial-Scan testing. The ability of the TCK and TDI input signals to perform dual functions stems from an ability to freeze the state of the TAP controller via its TMS signal.

DETAILED DESCRIPTION

Figure 1:
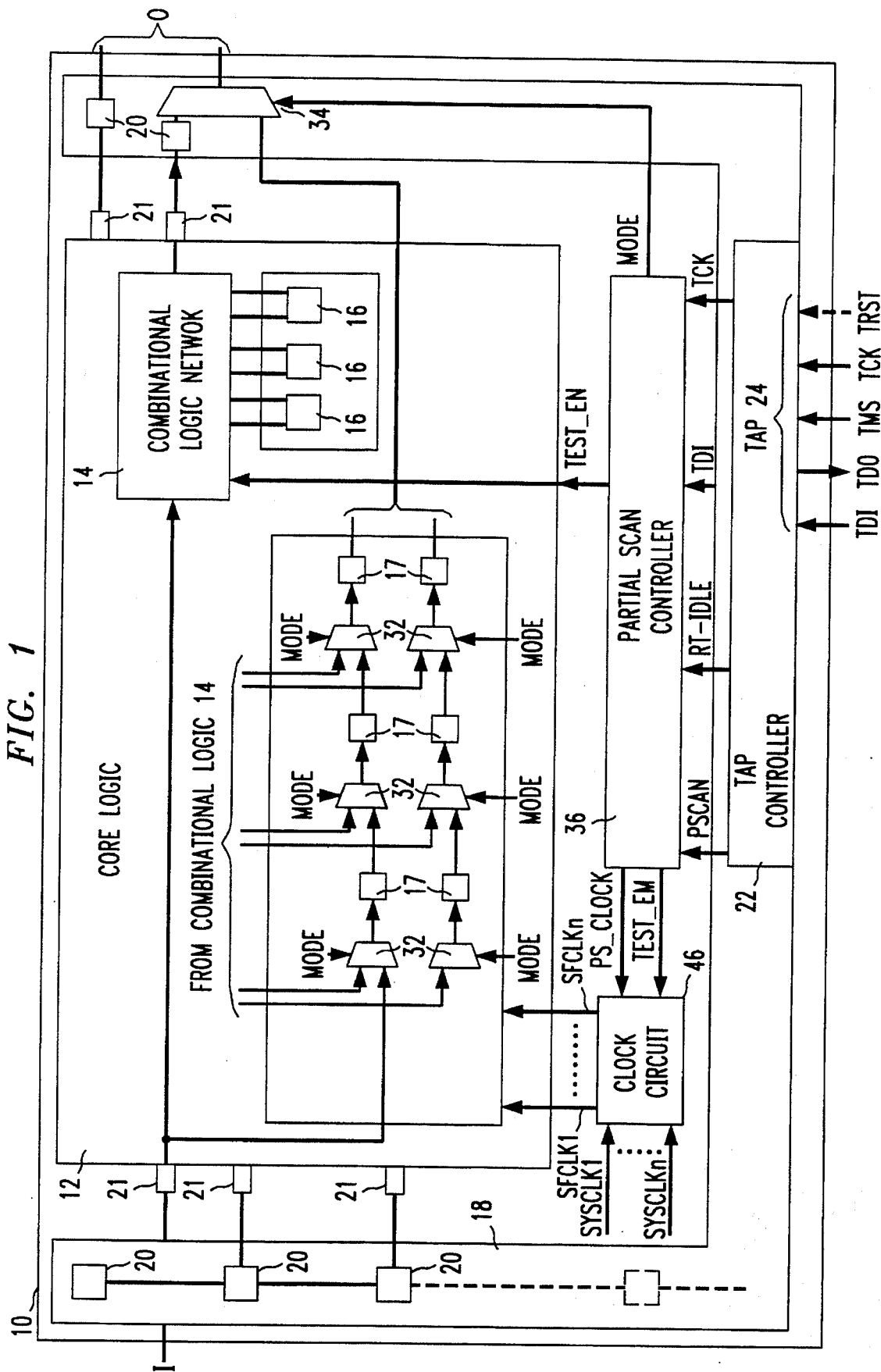
FIG. 1 is a block schematic diagram of an integrated circuit, in accordance with the invention, for undergoing Partial-Scan testing in response to signals entered through a Boundary-Scan Test Access Port on the circuit.

FIG. 1 shows an integrated circuit 10 having a built-in capability for undergoing Partial-Scan testing in accordance with the invention. The integrated circuit 10 includes a core logic portion 12 that performs one or more functions (e.g., signal processing, data storage, logic analysis, etc. ) in accordance with the design of the circuit. The core logic portion 12 of the integrated circuit 10 includes a network 14 of combinational logic elements (i.e., AND, NAND, NOT, NOR and/or OR gates (not shown)) and a plurality of sequential logic elements (flip-flops) 16 as well as a plurality of "scan" flip-flops 17 for effecting Partial-Scan testing. The structure of the network 14 and the manner in which it is connected to the flip-flops 16 and the scan slip-flops 17 depends on the functions to be performed by the integrated circuit 10.

In addition to its core logic portion 12, the integrated circuit 10 also has a Boundary-Scan architecture 18 that surrounds the core logic to render the integrated circuit compliant with the IEEE 1149.1 standard. The Boundary-Scan architecture 18 includes a plurality of Boundary-Scan cells 20 (i.e., single-bit registers) that are serially coupled in a single chain. Each Boundary-Scan cell 20 in the chain is linked to an input/output connection 21 of the core logic 12 of the integrated circuit 10.

The Boundary-Scan cells 20 are controlled by a Test Access Port (TAP) controller 22 that includes a TAP 24. The TAP 24 has a Test Data Input (TDI), a Test Mode Select (TMS) input, a Test Clock CTCK) input, and optionally, a Test Reset (TRST) input. In addition, the TAP 24 has a Test Data Output (TDO). As will be discussed in greater detail below, the TMS input of the TAP 24 allows the TAP controller 22 to receive a TMS signal that controls the state of the TAP controller. The TCK input allows the TAP controller 22 to receive a TCK signal that serves as a clock signal for the TAP controller. The TDI and TDO of the TAP 24 serve as an input and output, respectively, for allowing a stream of test data and test instructions to be shifted through the TAP controller 22.

Figure 2:
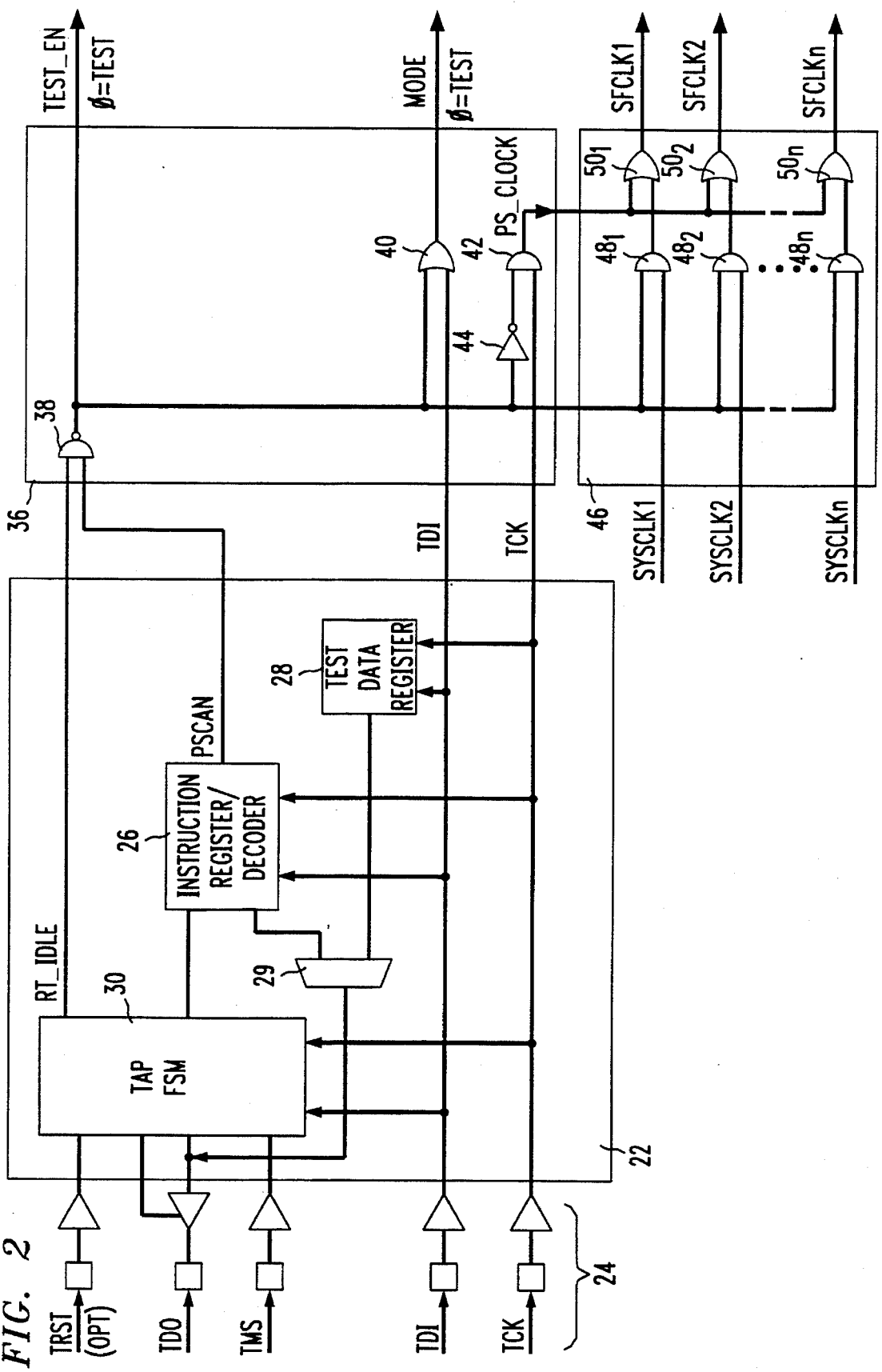
FIG. 2 is a block schematic diagram of a Partial-Scan control circuit comprising part of the integrated circuit of FIG. 1.

As best illustrated in FIG. 2, the TAP controller 22 includes a two-stage register 26, denominated as an instruction register, for holding instructions shifted through the TAP controller via the TDI and TDO of the TAP 24. The instruction register 26 includes a decoder that decodes the instructions in the register. In addition to the instruction register 26, the TAP controller 22 includes at least one test data register 28 (one of the test registers serves as the Boundary-Scan register). The test data register 28, which may be of the two-stage variety, serves to hold data that is shifted through the register via the TDI and TDO of the TAP 24. The scan data output signals produced by the registers 26 and 28 are multiplexer by a multiplexer 29 whose output is coupled to the TDO of the TAP 24. Also within the TAP controller 22 is a TAP Finite State Machine (FSM) 30 in the form of a network of combinational logic elements and flip-flops (not shown). As will be discussed in greater detail below with respect to FIG. 3, the TAP FSM 30 reacts to the TMS and TCK signals so as to enter into various states in response to such signals as described below.

Figure 3:
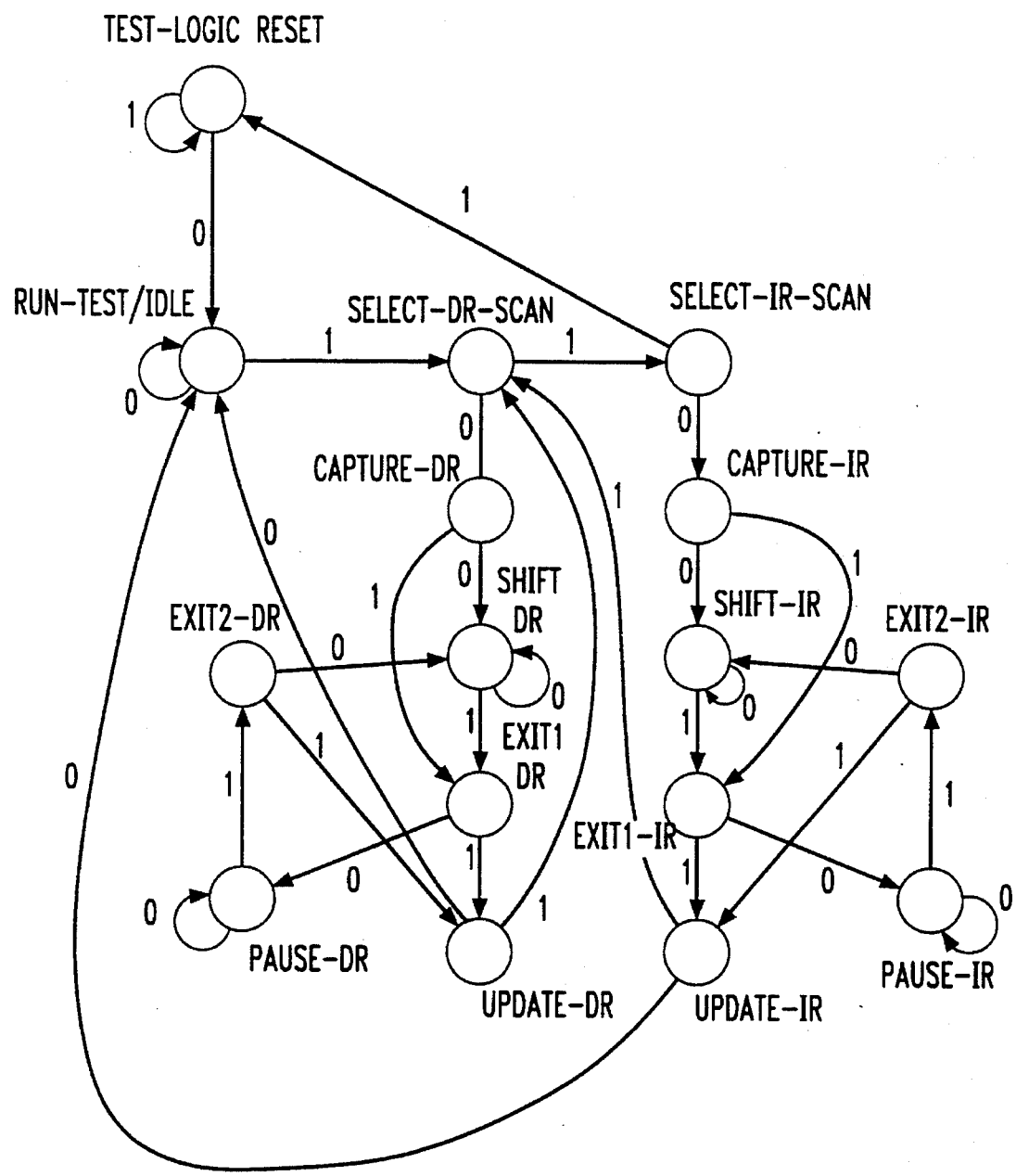
FIG. 3 is a state diagram of a TAP controller comprising part of the integrated circuit of FIG. 1.

To better understand the operation of the TAP FSM 30, reference should be had the TAP FSM state diagram illustrated in FIG. 3. During normal operation of the integrated circuit 10, the TAP FSM 30 of FIG. 2 is disabled and remains in a Test-Logic-Reset state so that the core logic 12 of the integrated circuit 10 of FIG. 1 can react normally to input information received at one or more of its input/output connections 21 of FIG. 1. The TAP FSM 30 enters the Test-Logic-Reset state while the TMS signal is held high for at least five rising edges of the TCK signal. The TAP controller 22 also enters the Test-Logic-Reset state when a logic "low" level signal is applied to the TRST input of the TAP 24 of FIG. 1, provided that the TAP includes a TRST input.

From the Test-Logic-Reset state, the TAP FSM 30 enters a Run-Test/Idle state when the TMS signal is held low and a rising edge is applied to the TCK input. The Run-Test/Idle state is a TAP FSM 30 state occurring between scan operations (i.e., operations during which data is shifted through either the instruction register 26 or one of the test data registers 28). In the Run-Test/Idle state, Partial-Scan test activity occurs when a Partial-Scan instruction (PSCAN) is present in the instruction register 26 of FIG. 2. For instructions that do not cause functions to execute in the Run-Test/Idle mode, the test data register 28 selected by a current instruction remains in its then-current state.

The TAP FSM 30 transitions from the Run-Test/Idle state to a Select-DR-Scan state when the TMS signal is held high and a rising edge is applied to the TCK input. The Select-DR-Scan state is a temporary state in which the test data register 28 of FIG. 2 remains in its current state. From the Select-DR-Scan state, the TAP FSM 30 enters a Select-IR-Scan state when the TMS signal is held high and a rising edge is applied to the TCK input. If the TMS signal is held low and a rising edge is applied to the TCK input, then the TAP FSM 30 enters a Capture-IR state described hereinafter.

Like the Select-DR-Scan state, the Select-IR-Scan state is a temporary state of the FSM 30 of FIG. 2 in which the test data register 28 of FIG. 2 that had been selected by a current instruction continues to remain in it current state. From the Select-IR-Scan state, the TAP FSM 30 enters the Capture-IR state and a scan sequence is initiated for the instruction register 26 of FIG. 2. During the Capture-IR state, the first or shift stage of the instruction register 26 receives a pattern of fixed values upon a rising edge of the TCK signal. The test data register 28 of FIG. 2 selected by the current instruction retains its previous state. Should the TMS signal be high, and a rising edge be present at the TCK input, then the TAP FSM 30 proceeds from the Select-IR-Scan state back to the Test-Logic-Reset state described previously rather than entering the Capture-IR state just described.

When the TAP FSM 30 is in the Capture-IR state, the TMS signal is held "low" and a rising edge is applied to the TCK input, then the TAP FSM 30 enters a Shift-IR state. In the Shift-IR state, the first stage of the instruction register 26 of FIG. 2 operates to shift an instruction, one bit at a time, between the TDI and TDO of the TAP 24 upon a rising edge applied to the TCK input. The test data register 28 selected by the current instruction remains unchanged.

From the Shift-IR state, the TAP FSM 30 enters an Exit1-IR state when the TMS signal is held high, the Exit1-IR state being a temporary one. Conversely, when the TMS signal remains low, the TAP FSM 30 remains in the Shift-IR state. If the TMS signal is held high, and a rising edge is applied to the TCK input while the TAP FSM 30 is in the Exit1-IR state, then the scanning mode (i.e., the shifting of bits from the instruction register 26 of FIG. 2) ceases and the TAP FSM 30 enters an Update-IR state. During the Update-IR state, the instruction that had been shifted into the first or shift stage of the instruction register 26 is now latched into the second (update) stage of the register upon the falling edge of the TCK signal. Upon being latched, the new instruction becomes the current instruction. When the TAP FSM 30 is in the Update-IR state, the TMS signal is held high, and a rising edge is applied to the TCK input, then the TAP FSM 30 enters the Select-DR-Scan state. Conversely, when the TMS signal is held low, the TAP FSM 30 enters the Run-Test/Idle state described previously.

From the Exit1-IR state, the TAP FSM 30 enters the Pause-IR state when the TMS signal is held low and a rising edge is applied to the TCK input. In the Pause-IR state, the TAP FSM 30 temporarily halts the shifting of instructions through the instruction register 26 of FIG. 2. Also, the test data register 28 of FIG. 2 selected by the current instruction remains in its current state.

From the Pause-IR state, the TAP FSM 30 enters an Exit2-IR state when the TMS signal goes high and a rising edge is applied to the TCK input. Like the Exit1-IR state, the Exit2-IR state is a temporary controller state during which the test data register 28 selected by the current instruction does not change states. From the Exit2-IR state, the TAP FSM 30 returns to the Shift-IR state described previously when the TMS signal is held low and a rising edge is applied to the TCK input.

As indicated previously, the TAP FSM 30 enters the Capture-DR state from the Select-DR-Scan state when the TMS is held low and a rising edge is applied to the TCK input. While the TAP FSM 30 is in the Capture-DR state, data may be parallel-loaded into the test data register 28 selected by the current instruction in the instruction register 26. If no test data register 28 is selected, or the selected test data register has no parallel input, then each test data register retains its previous state. From the Capture-DR state, the TAP FSM 30 either enters an Exit1-DR state or a Shift-DR state when the TMS signal is high and low, respectively, and a rising edge is applied to the TCK input.

In the Shift-DR state, the selected test data register 28 of FIG. 2 is placed in the serial path between TDI and TDO of the TAP 24 and serves to shift data, one bit at a time, upon each rising edge of the TCK signal. From the Shift-DR state, the TAP FSM 30 either enters the Exit1-DR state or remains in the Shift-DR state, depending on whether the TMS is held high or low, respectively, and a rising edge is applied to the TCK input. The Exit1-DR state is a temporary controller state during which each test data register 28 retains its current state. From the Exit1-DR state, the TAP FSM 30 either enters an Update-DR state or a Pause-DR state when the TMS signal is held high and low, respectively, and a rising edge is applied to the TCK input.

While the TAP FSM 30 is in the Pause-DR state, the shifting of the selected test data register 28 data along the serial path between the TDI and TDO of the TAP 24 is halted. The TAP FSM 30 remains in the Pause-DR state while the TMS signal is held low. Once the TMS signal goes high, and a rising edge is applied to the TCK input, then the TAP FSM 30 enters an Exit2-DR state, which, like the Exit2-IR state, is temporary. From the Exit2-DR state, the TAP FSM 30 enters the Shift-DR state described previously when the TMS signal is held low and a rising edge is applied to the TCK input. When the TMS signal is held high, and a rising edge is applied to the TCK input, then the TAP FSM 30 enters the Update-DR state.

In response to one of several prescribed instructions present in the instruction register 26 of FIG. 2 during the Update-DR state, data is latched upon the falling edge of the TCK signal into the selected test data register 28 provided with a latched parallel output. From the Update-DR state, the TAP FSM 30, upon a rising edge of the TCK, enters either the Select-DR-Scan state when the TMS signal is held high, or the Run-Test/Idle state when the TMS signal is held low. For further details concerning the structure and operation of the TAP FSM 30, reference should be had to the aforementioned publication *IEEE Standard Test Access Port and Boundary-Scan Architecture* (herein incorporated by reference).

To accomplish testing of the integrated circuit 10 in accordance with the Boundary-Scan technique set forth in the IEEE 1149.1 standard, a string of known values is shifted through the chain of Boundary-Scan cells 20 during the Shift-DR state of the TAP FSM 30. For each Boundary-Scan cell 20 of FIG. 1 associated with an output of the core logic 12, the bit previously latched into the cell now appears at the corresponding output node of the core logic 12. Those Boundary-Scan cells 20 which are each coupled to a separate input node of the core logic 12 capture the bit appearing at that node when that input node of the integrated circuit 10 of FIG. 1 is driven by another circuit (not shown) also undergoing Boundary-Scan testing. Once the Boundary-Scan cells 20 associated with the input nodes of the core logic 12 have captured the values appearing at such corresponding input nodes, then the values held by the Boundary-Scan cells in the chain are shifted out. The shifted-out chain of bits is compared to a reference stream of bits obtained under circumstances when no defects are present in the connections between the Boundary-Scan architecture devices coupled to the integrated circuit 10.

In addition to testing the integrated circuit 10 by the aforementioned Boundary-Scan test technique, it may also be desirable to test the integrated circuit by the Partial-Scan technique taught by the aforementioned U.S. Pat. No. 5,043,986 (incorporated by reference herein). Referring to FIG. 1, to facilitate Partial-Scan testing, the integrated circuit 10 includes the scan flip-flops 17 as indicated previously. As seen in FIG. 1, the scan flip-flops 17 are coupled in one or more chains. Each scan flip-flop 17 in each chain is supplied with the output of a multiplexer 32 that is provided at a first one of its inputs with the output of an upstream scan flip-flop in the chain. The second input to each multiplexer is supplied with a signal from the combinational logic network 14. In the case of the upstream-most multiplexer 32, its first input is supplied with a signal from a primary input to the integrated circuit 10 that is shared with an existing normal mode input to the integrated circuit 10.

To accomplish Partial-Scan testing, the integrated circuit 10 is placed in a test mode by controlling the state of each of the control signals TEST_EN and MODE. During the test mode, the control signal TEST_EN is forced to a logic low so as to block the asynchronous preset and clear capability of those of the flip-flops 16 having such a capability. In addition, when the TEST_EN signal is forced low, the system clock signal that would otherwise be supplied to the scan flip-flops 17 is blocked. Instead, the scan flip-flops 17 are clocked by the clock signal PS_CLOCK. Also during the test mode, the MODE signal, which controls the multiplexers 32 associated with the scan flip-flops 17, is free to toggle a logic low level from a high level and vice versa. While the MODE signal is at a logic low level, the output signal of an upstream scan flip-flop in the chain of scan flip-flops is passed via its associated multiplexer 32 to its downstream neighboring scan flip-flop rather than the signal from the combinational logic circuit 14. This is true for each of the scan flip-flops 17 in the chain except the first one. At this time, the first or upstream-most scan flip-flop 17 in the chain is supplied with a signal at a primary input of the integrated circuit 10, rather than a signal from the combinational logic circuit 14 as would occur during non-testing intervals.

In addition to controlling the multiplexers 32, the MODE signal also controls a multiplexer 34 which serves to multiplex the output signals of the combinational logic network 14 with the output signals from the chain(s) of scan flip-flops 17. While the MODE signal is low, the multiplexer 34 passes the signals from the chains of scan flip-flops 17 to the primary outputs of the integrated circuit 10. When the MODE signal is high, the multiplexer 34 passes the signal from the combinational logic network 14. It should be understood that although only one multiplexer 34 is shown in FIG. 1, additional multiplexers may be provided for multiplexing the output signals of the chains of scan flip-flops 17 with the output signals of the combinational logic network 14.

Initially, when the integrated circuit 10 enters the test mode, the clock signal PS_CLOCK is applied the scan flip-flops 17 in each chain to clock the flip-flops so that test data can be loaded therein. This phase is known as the "scan" mode. Once the test data has been loaded into the chains of scan flip-flops 17, then test patterns are applied to the primary inputs of the circuit 10, causing the circuit to generate a response at its primary outputs and at the inputs to the scan flip-flops. The responses appearing at the primary outputs are observed and compared to known values. Then the MODE signal is set to a logic high level and the scan flip-flops 17 are clocked by PS_CLOCK to capture this internal circuit response. This phase is known as the "apply" mode. Then the scan mode is re-entered (i.e., the MODE signal returns to a logic low level) and the data present in the chains of scan flip-flops 17 are shifted out and new test data is shifted in response to the PS_CLOCK signal. The shifted-out data are then compared to a set of reference values obtained when no defects are present.

In the past, the Partial-Scan test control signals PS_CLOCK, TEST_EN and MODE were generated externally and were applied to the integrated circuit 10 through a separate one of a set of dedicated pins (not shown). Thus, to receive the Partial-Scan testing control signals PS_CLOCK, TEST_EN and MODE, three additional pins were required in addition to the four pins required for Boundary-Scan testing. To overcome the need to dedicate additional pins for the Partial-Scan control signals PS_CLOCK, TEST_EN and MODE, the integrated circuit 10 of FIG. I is advantageously provided with a Partial-Scan controller 36 for generating these signals in accordance with signals from the TAP controller 22. In this way, the Partial-Scan control signals PS_CLOCK, TEST_EN and MODE are generated within the integrated circuit 10 itself rather than externally, thereby avoiding the need to dedicate any pins for receiving such signals.

Referring to FIG. 2, the Partial-Scan controller 36 includes a two-input NAND gate 38 that is supplied at its first input with a signal RT_IDLE generated by the TAP FSM 30. During the period that the TAP FSM 30 is in its Run-Test/Idle state, the RT_IDLE signal generated by the TAP FSM is at a high logic level, while during all other states, the RT IDLE signal is at a logic low level. The second input of the NAND gate 38 is supplied with a signal PSCAN from the instruction register 26. The signal PSCAN is at a logic high level when a Partial-Scan instruction is present in the instruction register 26, while the signal PSCAN is at a logic low state at all other times. Full compliance with the IEEE 1149.1 Standard is maintained because the PSCAN opcode is designated as a private instruction and is invoked only during device-level manufacturing testing.

The NAND gate 38 serves to produce the signal TEST_EN at its output. When both of the input signals to the NAND gate 38 are at a logic high level, as occurs when Partial-Scan testing is to occur, then the TEST_EN signal is at a logic low level, exactly the desired logic level of the TEST_EN signal for effecting Partial-Scan testing. When one (or both) of the signals RT IDLE and PSCAN is at a logic low level, as will occur during other than Partial-Scan testing intervals, then the signal TEST_EN is high, exactly the desired state for this signal during non-testing intervals.

The Partial-Scan controller 36 includes a two-input OR gate 40 for producing the MODE signal at its output. The OR gate 40 is supplied at its first input with the output signal of the NAND gate 38. At its second input, the OR gate 40 is supplied with the TDI signal received from the TAP 24. When the output signal TEST_EN of the NAND gate 38 is at a low level, the MODE signal assumes the logic level of the signal at the TDI primary input, allowing the MODE signal to be high or low during testing. Should the TEST_EN signal be at a logic high level, then the MODE signal will be forced to a logic high level, the desired signal state for the MODE signal during non-testing intervals.

In addition to producing the TEST_EN and MODE signals, the PartialScan controller 36 generates the control (clock) signal PS_CLOCK. The PS_CLOCK signal is produced at the output of a two-input AND gate 42 supplied at its first input with the clock signal TCK supplied to the Boundary-Scan TAP 24. The second input to the AND gate 42 is supplied with the output signal of the gate 38 through an inverter 44. In this way, the AND gate will generate a logic high level PS_CLOCK signal each time the TCK signal is at a logic high level and when the TEST_EN signal is at a logic low level. Thus, the AND gate 42 will only produce a logic high level PS-CLOCK signal when the TEST_EN signal is active (low), exactly the desired state of affairs for the PS_CLOCK signal during Partial-Scan testing intervals.

The PS_CLOCK signal generated by the Partial-Scan controller 36 in the manner described above is utilized to clock the scan flip-flops 17 of FIG. 1. However, the PS_CLOCK signal is only active during Partial-Scan intervals, and thus a mechanism is needed to clock the scan flip-flops during such other intervals. To that end, associated with the Partial-Scan controller 36 is a clock circuit 46 which operates to clock each of the scan flip-flops 17 in accordance with one of a set of system clock signals SYSCLK1, SYSCLK2 . . . SYSCLKn during non-test intervals and with the PS_CLOCK signals during Partial-Scan testing. The clock circuit 46 includes a set of n two-input AND gates $48_1$, $48_2$. . . $48_n$, each supplied at its respective first input with a separate one of the clock signals SYSCLK1, SYSCLK2 . . . SYSCLKn, respectively. The second input of each of the AND gates $48_1$–$48_n$ is supplied with the TEST_EN signal. In this way, each of the AND gates $48_1$–$48_n$ passes a separate one of thee clock signals SYSCLK1, SYSCLK2 . . . SYSCLKn, respectively, only when the TEST_EN signal is high, as occurs during intervals other than during Partial-Scan testing.

The clock circuit 48 also includes a set of n two-input OR gates $50_1$, $50_2$. . . $50_n$, each having its first input supplied with the output signal of a separate one of the AND gates $48_1$–$48_n$. The second input of each of the OR gates $50_1$–$50_n$ is supplied with the PS_CLOCK signal produced at the output of the AND gate 42. Each of the OR gates $50_1$–$50_n$ generates a separate one of a set of clock signals SFCLK 1, SFCLK2 . . . SFCLKn for clocking a respective one of the scan flip-flops 17. As may be appreciated, each of the clock signals SFCLK1, SFCLK2 . . . SFCLKn corresponds to a respective one of the system clock signals SYSCLK1, SYSCLK2 . . . SYSCLKn during non-test intervals. During test intervals, each of the clock signals SFCLK1, SFCLK2 . . . SFCLKn corresponds to the PS_CLOCK signal. In this way, each SCAN flip-flop 17 will be clocked by a PS_CLOCK signal during Partial-Scan testing, or with a corresponding one of the system clock signals SYSCLK1, SYSCLK2 . . . SYSCLKn during intervals other than Partial-Scan testing.

To accomplish Partial-Scan testing in accordance with the invention, the TAP FSM 30 of FIG. 2 is reset so as to be in the Test Logic Reset state. Such resetting is accomplished by applying a high logic level signal to the TMS input for five TCK clock cycles or by asserting the optional TRST signal to the TAP controller 22 of FIG. 1. At this time, the control signals TEST_EN and MODE will be at a logic high level and the Partial-Scan clock signal PS_CLOCK will be at a logic low level.

Once the TAP controller 22 is reset, then the instruction PSCAN, which initiates Partial-Scan testing, is shifted into the instruction register 26 via the TAP 24 during the Shift-IR state of the TAP FSM 30, as described previously with respect to FIG. 3. Upon subsequent entry of the TAP FSM 30 into the Update-IR state, a logic high level signal is applied to the TDI of the TAP 24 of FIGS. 1 and 2 to maintain the MODE signal at a logic high level. After the Update-IR state, the TAP FSM 30 goes to the Run-Test/Idle state and remains in that state for the duration of PartialScan testing.

As was discussed, in the Partial-Scan test mode, the TEST-EN signal is forced to a logic low state. The MODE signal will now be controlled by the signal at the TDI of the TAP 24 of FIGS. 1 and 2. The PS_CLOCK signal will be controlled by the clock signal present at the TCK input of the TAP 24. Regardless of the state of the signals present at the TCK and TDI, the TAP FSM 30 remains in the Run-Test/Idle mode as long as the TMS signal is held low. During Partial-Scan testing, the apply and scan modes, discussed previously, are entered into at separate intervals as required until Partial-Scan testing is completed.

To exit the Partial-Scan testing mode, the TAP FSM 30 is forced from the Run-Test/Idle mode by clocking the TCK input while the TMS signal is held high. Alternatively, the TAP controller 22 can be reset by applying a logic low level signal to the optional TRST input, when present. To resume normal operation, the TAP controller 22 is reset, as described, or a BYPASS or IDCODE instruction is scanned into the instruction register 26.

The foregoing discloses a technique for accomplishing Partial-Scan testing of the integrated circuit 10, with the advantage that the necessary control signals (PS_CLOCK, TEST_EN and MODE) are generated within the integrated circuit 10 itself in response to signals and instructions entered through the TAP 24. In particular, the TCK and TDI input signals perform the dual function of controlling conventional Boundary-Scan testing and Partial-Scan testing. The ability of the TCK and TDI signals to perform this dual task is possible because the TMS signal is able to freeze the state of the TAP FSM 30.

It is to be understood that the above-described embodiments are merely illustrative of the principles of the invention. Various modifications and changes may be made thereto by those skilled in the art which will embody the principles of the invention and fall within the spirit and scope thereof.

I claim:

1. A method for effecting Partial-Scan testing of a Boundary-Scan architecture integrated circuit having primary outputs and primary inputs, the circuit including a plurality of flip-flops partitioned into scan flip-flops and non-scan flip-flops, a Test Access Port (TAP) and a TAP controller, the method comprising the steps of:

loading a first Partial-Scan test instruction through the TAP of the integrated circuit to the TAP controller to place the TAP controller in a stable one of its states;

loading at least one subsequent Partial-Scan instruction through the TAP controller to a Partial-Scan controller;

executing, at the Partial-Scan controller, each subsequent Partial-Scan instruction to generate a set of Partial-Scan control signals in accordance with said subsequent Partial-Scan control instruction; and applying the Partial-Scan control signals to the integrated circuit to cause the integrated circuit to undergo Partial-Scan testing, whereupon (1) the scan flip-flops are first loaded with test data while the non-scan flip-flops are held in a constant state, (2) the integrated circuit (including the non-scan flip-flops) is rendered operative to react to the data in the scan flip-flops and to externally applied test data at the primary inputs so that new values may be present in the scan flip-flops and at the integrated circuit primary outputs depending on the defects in the integrated circuit, and (3) the data is then shifted from the scan flip-flops for comparison to a reference data stream indicative of integrated circuit operation when on defects are present.

2. The method according to claim 1 wherein the TAP controller control signals are processed within the integrated circuit by a Partial-Scan controller to generate three Partial-Scan control signals PS_CLOCK, TEST_EN and MODE.

3. The method according to claim 2 wherein the PS_CLOCK signal is derived from a TCK signal present at the TAP and serves to clock the scan flip-flops during Partial-Scan testing.

4. The method according to claim 2 wherein the TEST_EN signal is generated pursuant to receipt of a Partial-Scan test instruction scanned into the TAP to render the circuit testable by Partial-Scan testing.

5. The method according to claim 4 wherein the MODE signal is derived from a TDI signal present at the TAP and is employed to control the shifting of test data into and out of the integrated circuit.

6. A method for effecting Partial-Scan testing of a Boundary-Scan architecture integrated circuit having primary outputs and inputs, the integrated circuit including a combinational logic network, a plurality of flip-flops partitioned into scan flip-flops and non-scan flip-flops, a Test Access Port (TAP) having TCK and TDI inputs at which clock signals and test data signals, respectively, are received for effecting Boundary-Scan testing and for effecting Partial-Scan testing, and a TAP controller, the method comprising the steps of:

loading a first Partial-Scan test instruction through the TAP of the integrated circuit for receipt by the TAP controller to place the TAP controller in a stable one of its states;

loading at least one subsequent Partial-Scan instruction through the TAP controller to a Partial-Scan controller;

executing said subsequent Partial-Scan instruction at the Partial-Scan controller which generates a set of Partial-Scan control signals in accordance with said subsequent Partial-Scan instruction to obtain:

a Partial-Scan Clock signal (PS_CLOCK) supplied to each scan flip-flop to clock the scan flip-flops;

a Test Enable (TEST_EN) signal supplied to the integrated circuit to render the circuit testable by Partial-Scan testing; and a MODE signal for controlling the passage of output signals from the integrated circuit;

shifting test information through the scan flip-flops as they are clocked until the scan flip-flops are each loaded;

forcing the integrated circuit to operate in an apply mode and thereby react to the test information loaded in the scan flip-flops and external test information at the primary inputs to cause updated information to be present in the scan flip-flops and at the primary outputs; and shifting out the information present in the scan flip-flops for comparison to reference data indicative of no-defect operation of the integrated circuit.

* * * * *